United States Patent [19]

Furusawa et al.

[11] Patent Number: 5,495,668

[45] Date of Patent: Mar. 5, 1996

[54] MANUFACTURING METHOD FOR A SUPERMICRO-CONNECTOR

[75] Inventors: Keisuke Furusawa, Yokohama; Takao Orimo, Machida; Takuya Suzuki, Kawasaki, all of Japan

[73] Assignee: The Furukawa Electric Co., Ltd., Tokyo, Japan

[21] Appl. No.: 359,070

[22] Filed: Dec. 19, 1994

[30]    Foreign Application Priority Data

Jan. 13, 1994  [JP]  Japan .................................. 6-015883
Jul. 14, 1994  [JP]  Japan .................................. 6-161728

[51] Int. Cl.⁶ .............................................. H01R 43/16
[52] U.S. Cl. .............................. 29/879; 29/419.1; 29/876
[58] Field of Search ......................... 29/622, 846, 419.1, 29/876, 874

[56]         References Cited

U.S. PATENT DOCUMENTS

| | | | |
|---|---|---|---|
| 3,540,114 | 11/1970 | Roberts et al. .................. | 29/419.1 |
| 3,680,037 | 7/1972 | Nellis et al. .................... | 29/876 X |
| 3,818,588 | 6/1974 | Bates ............................. | 29/419.1 X |
| 3,828,417 | 8/1974 | Divecha .......................... | 29/419.1 |
| 3,882,587 | 5/1975 | Schneider et al. ................ | 29/919.1 |
| 5,179,778 | 1/1993 | Dickson et al. .................. | 29/876 |

FOREIGN PATENT DOCUMENTS

| | | |
|---|---|---|
| 60-14474 | 4/1985 | Japan . |
| 2-312251 | 12/1990 | Japan . |
| 6-28121 | 4/1994 | Japan . |

*Primary Examiner*—Carl J. Arbes
*Attorney, Agent, or Firm*—Frishauf, Holtz, Goodman, Langer & Chick

[57]           ABSTRACT

A manufacturing method for a supermicro-connector, comprising: a step of fixing a plurality of conductor wires, arranged substantially parallel to one another, by means of an elastic insulator interposed between the conductor wires, thereby making a composite structure formed of the conductor wires and the insulator; a step of cutting the composite structure along a plane extending at right angles to the conductor wires, thereby making a plurality of composite chips; a step of removing the insulator from at least one cut surface of each of the composite chips by dissolution by means of an agent, thereby exposing the respective end portions of the conductor wires for a predetermined length; and a step of forming solder bumps individually on the respective exposed end portions of the conductor wires.

30 Claims, 6 Drawing Sheets

MANUFACTURING METHOD FOR A SUPERMICRO-CONNECTOR

BACKGROUND OF THE INVENTION

1. Field of the Invention

The present invention relates to a manufacturing method for supermicro-connectors capable of connecting electrodes of semiconductor chips and circuit boards electrically to one another with high reliability.

2. Description of the Related Art

Semiconductor chips are formed each with a large number of electrodes arranged at fine pitches. With the progress of high-integration versions of circuits, the number of electrodes used in each chip is increasing steadily. Dual in-line packages (DIPs) which use lead frames had been prevalent means for electrical connection between the electrodes of the semiconductor chips and external equipment. As the electrodes of each chip increased in number and came to require latticed or multilayer arrangement, however, the conventional DIPs of the lead-frame type ceased to be effective connecting means.

In the case where a large number of electrodes are used in each semiconductor chip, therefore, the bare chip packaging method (also referred to as chip-on-board method or flip chip method) is employed. According to this method, the electrodes of each semiconductor chip and electrodes of a circuit board, which are as many as those of the chip and are arranged at pitches equal to the arrangement pitches of the chip electrodes, are connected by reflow soldering using solder balls, whereby the semiconductor chip is mounted directly on the circuit board.

In this bare chip packaging method, however, the electrodes of the semiconductor chip and the circuit board are connected directly to one another by means of the solder balls. As the temperature rises during use, therefore, the circuit board, having the semiconductor chip mounted directly thereon by this method, is subjected to thermal strain which is attributable to the difference in thermal expansion between the chip and the board. This thermal strain would be concentrated on soldered regions to damage them, thereby causing connection failure.

SUMMARY OF THE INVENTION

The object of the present invention is to provide a manufacturing method for supermicro-connectors (hereinafter referred to as "SMCs") with excellent connecting performance and high reliability, capable of satisfactorily connecting electrodes of semiconductor chips and circuit boards without involving any substantial connection failure.

In order to achieve the above object, a manufacturing method for an SMC according to claim 1 comprises: a step of fixing a plurality of conductor wires, arranged substantially parallel to one another, by means of an elastic insulator interposed between the conductor wires, thereby making a composite structure formed of the conductor wires and the insulator; a step of cutting the composite structure along a plane extending at right angles to the conductor wires, thereby making a plurality of composite chips; a step of removing the insulator from at least one cut surface of each of the composite chips by dissolution by means of an agent, thereby exposing the respective end portions of the conductor wires for a predetermined length; and a step of forming solder bumps individually on the respective exposed end portions of the conductor wires.

According to the method of the present invention, high-reliability SMCs can be manufactured such that the solder bumps formed individually on the conductor wires are uniform in shape, the bonding strength between the electrodes and the conductor wires is high, thermal strain can be absorbed during use, and hence, the connection between the electrodes of the semiconductor chips and the circuit boards is highly reliable. Thus, the method of the invention can produce outstanding industrial effects.

The above and other objects, features, and advantages of the invention will be more apparent from the ensuing detailed description taken in connection with the accompanying drawings.

DETAILED DESCRIPTION OF THE PREFERRED EMBODIMENTS

Referring now to FIGS. 1A to 1F, a manufacturing method for an SMC according to the present invention will be described in detail.

Figure 1A:
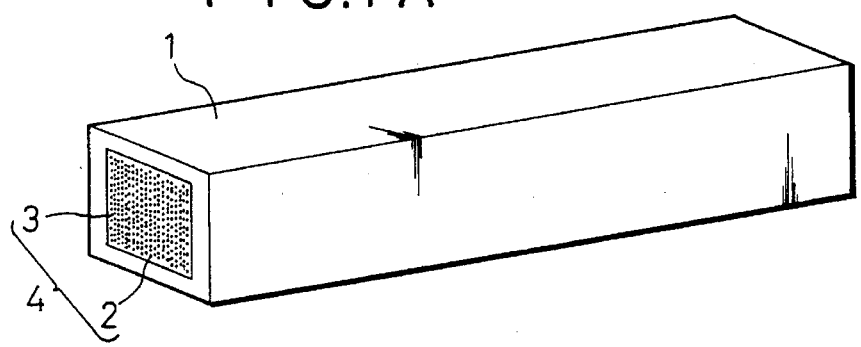
FIGS. 1A, 1B, 1C, 1D, 1E and 1F are process diagrams for roughly illustrating a manufacturing method for a supermicro-connector according to the present invention.
Figure 1B:
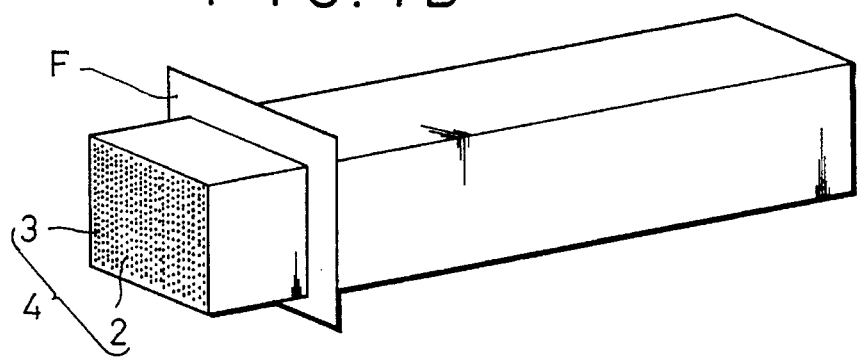

First, a large number of conductor wires 2 are stretched in a predetermined pattern in a square metallic pipe 1 with high-accuracy dimensions so as to extend substantially parallel to the axis of the pipe 1. A liquid insulator 3 is injected into the square pipe 1 and solidified therein. Thereupon, a composite structure 4 is formed including a number of substantially parallel conductor wires 2 which are fixed by means of the insulator 3 (FIG. 1A).

Figure 1C:
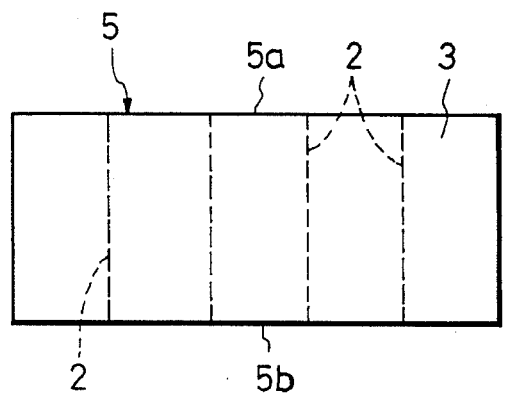

Then, the composite structure 4 is drawn out of the square pipe 1 (FIG. 1B), and is cut along a plane F which extends at right angles to the conductor wires 2, whereupon a thin composite chip 5 with a predetermined thickness is obtained (FIG. 1C).

Figure 1D:
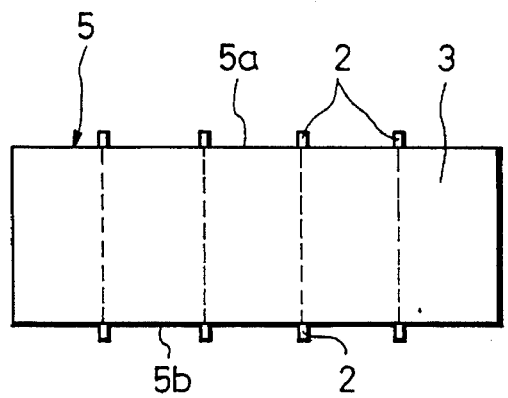

Subsequently, the insulator 3 is dissolvingly removed from the composite chip 5 through cut surfaces 5a and 5b thereof by means of an agent, whereby the respective end portions of the conductor wires 2 are exposed for a predetermined length each (FIG. 1D).

Figure 1E:
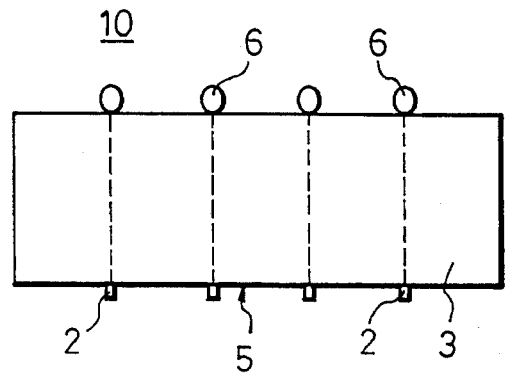

An SMC 10 is manufactured by collectively forming substantially spherical solder bumps 6 individually on the respective one-side end portions of the exposed conductor wires 2 (FIG. 1E).

In FIGS. 1C, 1D, 1E and 1F, the illustrated conductor wires 2 are limited to four in number for simplicity. Also in FIGS. 5, 6, 7 and 8 which will be mentioned later, illustration of most of the conductor wires 2 is omitted for the same reason.

In a method according to claim 1, the insulator used should preferably have a coefficient of thermal expansion which is intermediate between those of a semiconductor chip and a circuit board. The insulator of this type can prevent the solder bumps from being subjected to thermal strain which is attributable to the difference in the coefficient of thermal expansion from the semiconductor chip or the circuit board, and hence, from lowering the electrical connection performance.

A method according to claim 2 is a manufacturing method for an SMC, which comprises a step of further dissolvingly removing the insulator on the side for the formation of the solder bumps by means of the agent, thereby exposing the conductor wires for a predetermined length between the solder bumps and the insulator, after the step of forming the solder bumps on the exposed end portions of the conductor wires.

Figure 1F:
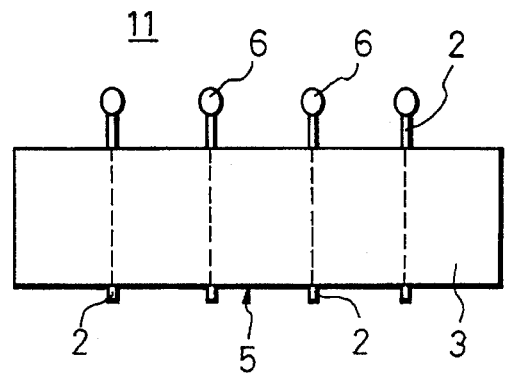

In the method according to claim 2, the insulator 3 on the side for the formation of the solder bumps 6 is further removed from the SMC 10 shown in FIG. 1E by means of the agent, whereby an SMC 11 with its conductor wires 2 exposed is manufactured (FIG. 1F).

In the SMC 11 manufactured by the method according to claim 2, the conductor wires 2 are exposed for the predetermined length between the solder bumps 6 and the insulator 3. When electrodes of the semiconductor chip or the circuit board are connected by soldering, thermal strain may be caused by the difference in the coefficient of thermal expansion between the insulator and the semiconductor chip or the circuit board. Even in such a case, according to this SMC 11, the thermal strain is absorbed by deformation of the exposed portions of the conductor wires, and the exposedness of the wires ensures improved heat radiation property.

The reason why an elastic insulator is used as the insulator to be interposed between the conductor wires according to the method of the present invention is that a thermal stress produced by soldering between the SMC and the electrodes of the semiconductor chip or the circuit board is absorbed by deformation of the insulator, so that the deformation of the conductor wires attributable to change of the distance between the electrodes or thermal expansion is not likely to be inhibited, and hence, high connectibility between the electrodes can be maintained.

Silicone rubber or polymeric elastomer may be suitably used as the elastic insulator. In particular, expanded silicone rubber is liable to less deformation by thermal expansion. A connector is interposed between the semiconductor chip and the circuit board, the respective electrodes of the semiconductor chip and the circuit board and conductor wires of the connector are aligned with another and are then soldered together by heating. In doing this, the electrodes and the conductor wires cannot be dislocated.

The size of the solder bumps depends on the length of those portions of the conductor wires which are exposed from at least one cut surface of the composite chip. The bumps are formed on the exposed end portions of the conductor wires by a conventional method, e.g., by dipping the end portions in a solder bath or applying solder paste to the end portions by means of a brush. The length of those portions of the wires which are further exposed between the solder bumps and the insulator, after the bumps are formed in this manner, is a length such that the connection between the exposed conductor wires and the semiconductor chip or between the wires and the circuit board by soldering or the like is easy, and is changed variously depending on the material used.

Preferably, the length of the exposed portions of the conductor wires before the formation of the solder bumps range from 0.02 to 0.1 mm. If this length is shorter than 0.02 mm, solder bumps of an adequate size cannot be formed. If the length of exposure of the wires is longer than 0.1 mm, on the other hand, solder bumps of a proper shape, substantially spherical, cannot be formed.

In the case where the conductor wires are further exposed after the formation of the solder bumps, in contrast with this, their length of exposure should preferably be not shorter than 0.2 mm. If this length is shorter than 0.2 mm, it is impossible to secure a space in which a positioning jig is used to solder the wires to the semiconductor chip and the circuit board. Thus, the soldering operation is difficult, and the accuracy of positioning on the semiconductor chip and the circuit board is lowered.

The solder used for the formation of the bumps may be selected among ones for low-temperature use, such as Bi—In, In, Bi—Sn solders, as well as Sn—Pb solder, pure Sn, etc. which are employed usually. In the case where silicone rubber is used as the insulator, however, solders with the melting point of 320° C. or more cannot be used in consideration of the heat resistance of silicone rubber.

A commercially available agent is used as the agent for dissolvingly removing the insulator. If the insulator is silicone rubber, for example, a substantially linear relationship is established between the amount of dissolution and lapse of time, and a 2-methoxyethanol solvent is used whereby the removal of the insulator can be easily controlled with time.

Figure 2A:
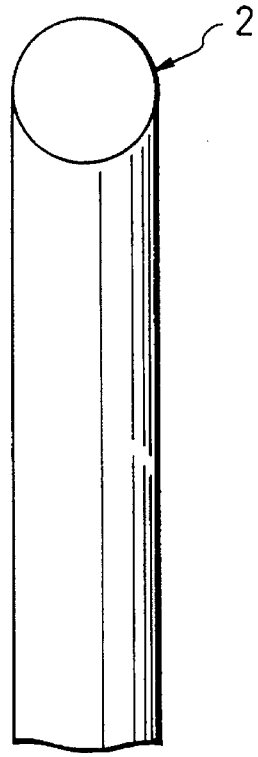
FIGS. 2A, 2B 2C and 2D are perspective views showing the shapes of conductor wires used in the method of the invention.

Any electrically conductive material may be applied to the conductor wires which are used according to the method of the present invention. More specifically, phosphor bronze, Cu—Be alloy, nickel silver, Corson alloy, or other copper alloy material is available. Each conductor wire may be a round wire (FIG. 2A), square wire, stranded wire combining these wires, or shaped wire.

While the coefficient of thermal expansion of a metal material which constitutes the conductor wires is 10° to 20°×10$^{-6}$/° C., that of silicone rubber is as high as 200° to 300°×10$^{-6}$/° C. In the case where silicone rubber is used as the insulator, therefore, the insulator is expanded by a temperature rise during the formation of the solder bumps, and is liable to be separated from the conductor wires. As a result, the force of the insulator (silicone rubber) to hold the wires is reduced, so that the wires can be easily disengaged from the insulator during the manufacture of the SMC. To avoid this, it is advisable to give the conductor wires a shape such that they cannot be easily separated from the insulator.

Figure 2B:
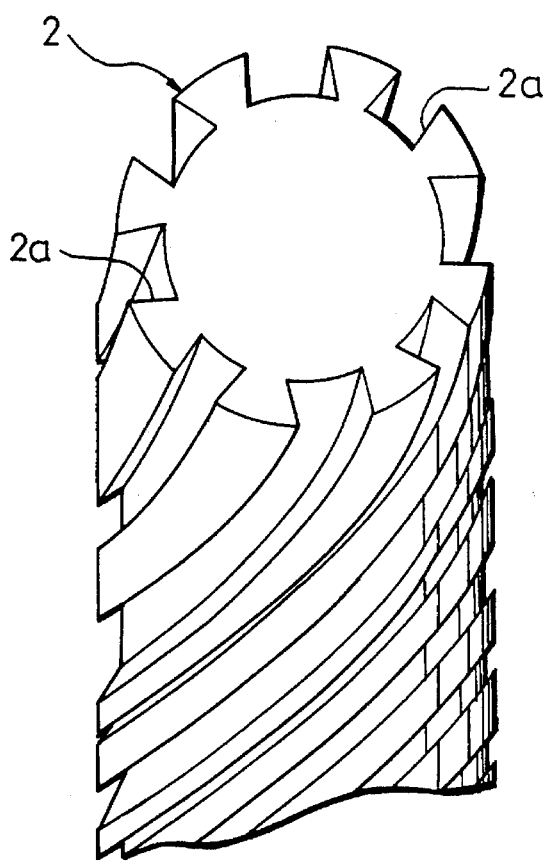

FIG. 2B shows a shaped conductor wire 2 as an example of a wire which is shaped so as not to be easily separated from the insulator. This wire is provided thereon with a necessary number of channels 2a whose opening is narrower than their inside space. With use of this shaped wire, the insulator gets into the channels 2a, so that the area of contact with the wire is wide. As the temperature rises during the use of the SMC, therefore, the insulator expands so that it is clamped fast to the regions in- and outside the channels 2a. If the shaped wire is twisted so that the channels 2a are spiral in shape, the conductor wires can be restrained from longitudinally shifting its position in the insulator.

Figure 2C:
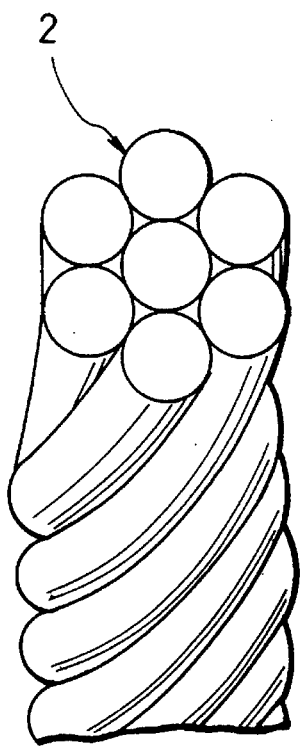
Figure 2D:
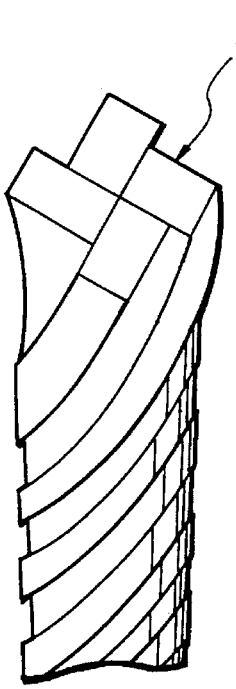

Also in the case of a conductor wire 2 formed of a stranded wire shown in FIG. 2C, its area of contact with the insulator can be made wide, and the stranded wire is twisted in the longitudinal direction. Thus, the longitudinal shift of the conductor wire can be restrained. In a conductor wire 2 shown in FIG. 2D, square wires are joined together so that the surface of the resulting structure is rugged. In this case, the contact area is wider than in the case of the conventional stranded wire shown in FIG. 2C, so that the movement of the conductor wire can be restrained more positively.

Dislocation of the conductor wires can be restrained more securely if the insulator and the conductor wires are bonded by means of an adhesive agent. Preferably, the adhesive agent should be a primer which can bond a metal material, silicone rubber, etc. In bonding the insulator and the conductor wires, the primer is applied to the wires in advance.

Figure 3A:
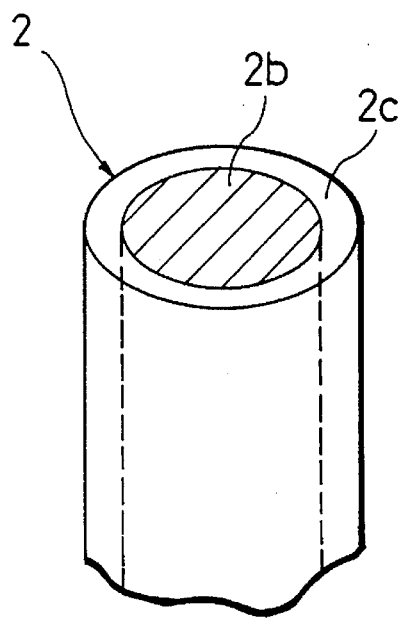
FIGS. 3A and 3B are perspectives views showing a conductor wire used in the method of the invention, an end portion of the wire being eroded by means of a corrosive agent.
Figure 3B:
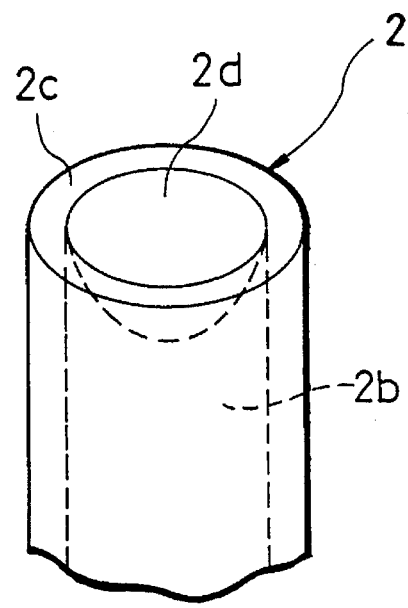

In order to form the solder bumps steadily into a predetermined shape, according to the method of the present invention, it is advisable to use a conductor wire 2 shown in FIGS. 3A and 3B. The wire 2 is a composite wire (FIG. 3A) which is composed of a core member 2b and a covering member 2c. The core member 2b is formed of a material which is erodible by a specific corrosive liquid, while the covering member 2c is formed of a material which is not erodible. When an end portion of this wire 2 is dipped into the corrosive liquid, the core member 2b is eroded so that a cup-shaped depression 2d is formed in its top portion (FIG. 3B). When the top portion of the member 2b is dipped into a solder bath, solder solidifies in the depression 2d. The shape of the depression 2d can be freely changed depending on the conditions of corrosion.

A method according to claim 13 or 14 is a manufacturing method for an SMC, in which a plurality of conductor wires are laminated into a plurality of parallel conductor wire rows arranged at predetermined intervals under a tension applied by means of a plurality of members having different heights and formed with a plurality of V-grooves arranged at regular pitches, in the step of fixing the plurality of conductor wires, arranged substantially parallel to one another, by means of the elastic insulator interposed between the conductor wires, thereby making the composite structure formed of the conductor wires and the insulator.

In the manufacturing method according to claim 13 or 14, the conductor wires are positioned by utilizing the V-grooves, so that the operation is easy. The conductor wires can be accurately positioned with respect to the direction of their arrangement by using V-grooved bridges, which are obtained by rectangularly cutting an iron block having V-grooves arranged at regular pitches thereon.

The tension can be easily applied to each conductor wire by pulling it by means of a weight which is attached to an end portion thereof. The lamination intervals between the parallel conductor wire rows can be accurately adjusted by means of spacers interposed between the wire rows.

A method according to claim 21 or 22 is a manufacturing method for an SMC, in which the elastic insulator is formed of a condensed-type silicone rubber.

Since silicone rubber has high heat resistance and flux resistance, the insulator can appropriately stand the environment for soldering. Since silicone rubber can dissolve relatively stably in an agent, moreover, the length of exposure of the conductor wires can be made uniform. An additional-type silicone rubber with a high degree of polymerization, among other types, requires a long time for dissolution, and may swell and get out of shape during dissolution, in some cases. In contrast with this, a condensed-type silicone rubber, which has a low degree of polymerization and contains a relatively large quantity of filler, dissolves uniformly in a short period of time, so that it can be a suitable material for the insulator.

A method according to claim 23 or 24 is a manufacturing method for an SMC, in which the respective end portions of the conductor wires are exposed from both cut surfaces of each of the composite chips, those end portions of the conductor wires which are exposed from one of the cut surfaces are connected electrically to a metallic electrode plate, and the solder bumps are formed individually, by electroplating, on those end portions of the conductor wires which are exposed from the other cut surface, in the step of dissolvingly removing the insulator from at least one cut surface of each of the composite chips by means of the agent, thereby exposing the respective end portions of the conductor wires for the predetermined length, and the step of forming the solder bumps individually on the respective exposed end portions of the conductor wires.

The solder bumps are formed on the respective end portions of the conductor wires which are exposed from each composite chip, and the semiconductor chip or the circuit board is connected to the bumps.

It is difficult to form large solder bumps by the hot dip method. However, the electroplating method can produce solder bumps of any desired size and uniform shape.

A method according to claim 25 or 26 is a manufacturing method for an SMC, in which electrically conductive paste is applied to the one cut surface of each of the composite chip along with the exposed conductor wires, the surface of the paste is coated for insulation, and the conductor wires exposed from the one cut surface and the conductive paste are brought into contact with a conductor connected to a power source, to be supplied with electric power, whereby the solder bumps are formed by electroplating on the conductor wires exposed from the other cut surface.

The conductive paste used may, for example, be resin paste in which copper or silver powder is dispersed. The efficiency of operation for the electrical supply can be improved by drying and solidifying the conductive paste and bringing it into contact with the conductor. Preferably, those portions which require no solder-plating should be insulated by means of manicure or the like so that the solder bumps can enjoy a more accurate shape.

Figure 8:
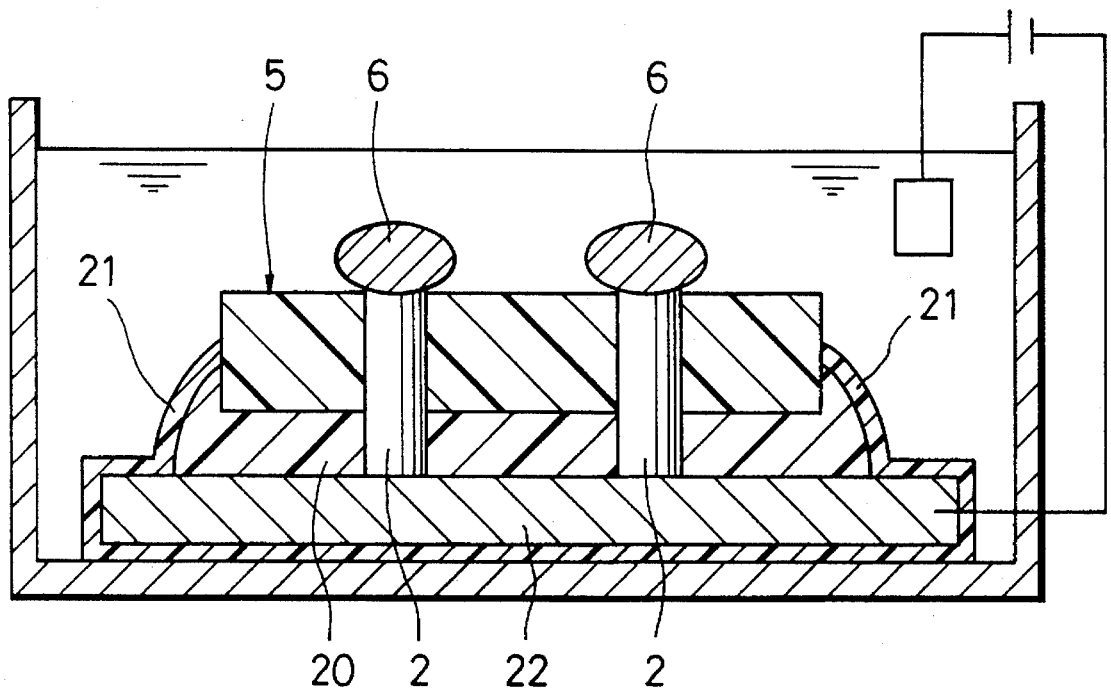
FIG. 8 is a sectional view illustrating the way solder bumps are formed on a plurality of conductor wires of a composite chip by electroplating.

FIG. 8 is a sectional view showing the way the solder bumps 6 are formed on the conductor wires 2 of the composite chip 5. Electrically conductive paste 20 is applied to the conductor wires 2 exposed from the one cut surface of the chip 5, and an electrode plate 22 is connected electrically to the paste 20. The conductive paste 20 and the electrode plate 22 are insulated by means of a manicure layer 21 (or insulating film or the like).

The connection between the conductor wires 2 and the electrode plate 22 can be made perfect by applying the conductive paste 20 to the supply-side end portions of the conductor wires 2 and bringing it into contact with the plate 22 which is connected to the power source. To attain this, the length of exposure of the conductor wires 2 on the electrical supply side should be made long enough to ensure the contact between the paste 20 and the exposed wires 2. If the conductive paste 20 is dry and solid, it can be easily removed by being dissolved in a solvent or by a chemical method after the solder-plating.

Thus, in the SMC manufacturing method according claim 25 or 26, the solder bumps of any desired size can be formed uniformly on the respective end portions of hundreds or thousands of conductor wires with ease.

A method according to claim 27 or 28 is a manufacturing method for an SMC, in which the conductor wires are gold wires or gilt conductor wires.

The electrodes of the semiconductor chip or the circuit board are connected to the conductor wires. Accordingly, the conductor wires are expected to have satisfactory solderability. The surface of the gold wires or gilt conductor wires cannot be easily oxidized, and these wires enjoy good environmental resistance and low contact resistance, so that electricity can be supplied uniformly to the exposed conductor wires. Thus, solder bumps of uniform size can be formed individually on a large number of exposed conductor wires by electroplating.

Since the gold wires or gilt conductor wires do not react to In, moreover, the electrical supply can be further ensured by depositing a low-melting In-based solder on the supply-side exposed end portions of the wires and connecting a metallic electrode plate directly to the In-base solder. Since the gold wires or gilt conductor wires are highly resistant to acids, furthermore, removal of the In-base solder by dissolution and acid washing after the completion of the solder-plating can be accomplished with ease, so that the conductor wires cannot be damaged.

A method according to claim 29 or 30 is a manufacturing method for an SMC, in which the surface of each conductor wire is roughed by an electrolytic treatment or chemical etching.

The anchoring force between the conductor wires and the insulator of the composite chip may depend on the elastic force of the insulator or the force of shape retention of the wires. By roughing the wire surface, the area of contact between the conductor wires and the insulator is increased to enhance the anchoring force, so that the reliability for use as a connector is improved.

In any of the methods according to the present invention, (1) a plurality of conductor wires, which are arranged substantially parallel to one another, are fixed by means of an elastic insulator which is interposed between the wires, whereby a composite structure formed of the conductor wires and the insulator is made, and the composite structure is cut along a plane extending at right angles to the conductor wires, to make a plurality of composite chips. In this manner, high-accuracy composite chips can be mass-produced. (2) The length of exposure of the conductor wires can be freely controlled by dissolvingly removing the insulator by means of an agent to expose the wires from each composite chip. Thus, solder bumps with a predetermined shape can be formed steadily on the exposed conductor wires. (3) Since the solder bumps are formed on the conductor wires exposed from the composite chip, they can be controlled in shape and size. (4) Since the conductor wires between the solder bumps and the insulator are exposed for a predetermined length, a positioning jig can be used to solder the wires to a semiconductor chip, so that the positioning accuracy is improved. (5) The aforesaid exposure of the conductor wires facilitates the operation for soldering the wires to a circuit board or the like, and ensures firm connection. (6) Since the elastic insulator is interposed between the conductor wire, a thermal stress produced by soldering is absorbed by deformation of the insulator, so that dislocation between the electrodes and the conductor wires cannot be caused.

According to the present invention, moreover, (7) a large number of superfine conductor wires can be arranged substantially parallel to one another with ease by using bridges which have V-grooves. (8) The accuracy of arrangement of the conductor wires in the V-grooves of the bridges can be easily improved by pulling the wires by means of weights which are attached individually to the respective end portions of the wires. (9) The position of the conductor wires in the V-grooves of the bridges with respect to the direction of arrangement (width) can be accurately settled by arranging the conductor wires in the V-grooves which are formed at regular pitches. Also, the lamination intervals between a plurality of parallel conductor wire rows can be easily adjusted by means of spacers interposed between the wire rows. (10) If a condensed-type silicone rubber, which has a low degree of polymerization and contains a relatively large quantity of filler, is used as a material of the insulator, the conductor wires can be exposed for a uniform length in a short period of time. (11) If the solder bumps are formed by electroplating, they can enjoy a desired size and uniform shape. (12) Electrical supply for electroplating can be easily effected by applying electrically conductive paste to one cut surface of each of the composite chip along with the exposed conductor wires, coating the paste for insulation, and then connecting the conductor wires and the paste electrically to a conductor which is connected to a power source. (13) If the conductor wires are formed of gold wires or gilt conductor wires, whose surface cannot be easily oxidized and which enjoy good environmental resistance, the solder bumps with uniform shape can be formed individually on the exposed conductor wires by electroplating. (14) If the surface of each conductor wire is roughed by an electrolytic treatment or chemical etching, the area of contact between the conductor wires and the insulator is increased to enhance the anchoring force between them.

Embodiment 1

SMCs 10 were manufactured according to processes shown in FIGS. 1A to 1F.

Gilt conductor wires 2 (diameter: 0.08 mm) formed of phosphor bronze (Cu, 8% Sn, 0.13% P, by weight) and 1,600 in number were arranged at pitches of 0.25 mm in a square pipe 1 of low-carbon steel, measuring 500 mm in length and 15±0.01 mm by 15±0.01 mm in cross-sectional area, so as to stretch substantially parallel to the axis of the pipe 1. A liquid silicone rubber for use as an insulator 3 was injected into the pipe 1 and solidified therein, whereupon a composite structure 4 formed of the conductor wires 2 and the insulator 3 was obtained (FIG. 1A).

Then, the composite structure 4 was drawn out of the square pipe 1 (FIG. 1B), and was cut along a plane F which extends at right angles to the conductor wires 2, whereupon a composite chip 5 with the thickness of 1.5 mm was obtained (FIG. 1C). An additional-type silicone rubber with a high degree of polymerization was used for the insulator 3.

Subsequently, the composite chip 5 was dipped into 2-methoxyethanol, the insulator 3 was dissolvingly removed from the chip 5 through cut surfaces 5a and 5b thereof, whereby the respective end portions of the conductor wires 2 were exposed for a length of 0.02 mm each (FIG. 1D).

Thereafter, each SMC 10 of FIG. 1E, measuring 15 mm by 15 mm by 1.5 mm, was manufactured by dipping the one end side of the exposed conductor wires 2 into a solder bath and forming solder bumps 6 individually on the respective one-side ends of the exposed conductor wires 2.

An Sn-Pb high-temperature solder, containing 90% Pb and 10% Sn by weight and having a melting point of 280° to 300° C., was used for the solder bath.

In stretching the conductor wires substantially in parallel relation at pitches of 0.25 mm, two guide plates, each having 1,600 holes (in total) with the diameter of 0.083 mm arranged at pitches of 0.25 mm in both vertical and horizontal directions, were located corresponding individually to the opposite ends of the pipe 1 with a space of 500 mm between them, and the wires 2 were passed individually through the holes of the guide plates.

Embodiment 2

Each SMC 10 of FIG. 1E, measuring 15 mm by 15 mm by 1.5 mm, was manufactured in the same manner as in Embodiment 1 except that expanded silicone rubber was used for the insulator.

Embodiment 3

That side of each SMC 10 of FIG. 1E obtained in Embodiment 1 on which the solder bumps 6 are formed was dipped again into the agent (2-methoxyethanol) to remove the insulator 3 further by dissolution, whereupon the conductor wires 2 were exposed for 0.25 mm between the solder bumps 6 and the insulator 3. Thus, each SMC 11 of FIG. 1F, measuring 15 mm by 15 mm by 1.5 mm, was manufactured.

Embodiment 4

Each SMC 11 of FIG. 1F, measuring 15 mm by 15 mm by 1.5 mm, was manufactured in the same manner as in Embodiments 1 and 3 except that expanded silicone rubber was used for the insulator.

Embodiment 5

Each SMC 11 of FIG. 1F, measuring 15 mm by 15 mm by 1.5 mm, was manufactured in the same manner as in Embodiments 1 and 3 except for the use of conductor wires 2 of 0.08-mm diameter having the channels 2a, as shown in FIG. 2B, and guide plates having the hole diameter of 0.083 mm.

Embodiment 6

Each SMC 11 of FIG. 1F, measuring 15 mm by 15 mm by 1.5 mm, was manufactured in the same manner as in Embodiments 1 and 3 except for the use of stranded wires such as the one shown in FIG. 2C (7-strand wire of phosphor bronze with diameter of 0.08 mm) and guide plates having the hole diameter of 0.083 mm.

A thousand SMCs 10 and 1,000 SMCs 11 manufactured according to Embodiments 1 to 6 were prepared, and were connected to electrodes of semiconductor chips and circuit boards by means of their corresponding conductor wires. The connection was made following the steps of procedure shown in FIGS. 5A to 5F.

FIGS. 5A to 5F show the case in which each SMC 11 is connected to electrodes of a semiconductor chip and a circuit board by means of their corresponding conductor wires. Since the steps of procedure shown in FIGS. 5A to 5F can be also applied to the case of SMCs 10, however, only the case of the SMCs 11 will be described below, that is, a description of the case of the SMCs 10 will be omitted.

A semiconductor chip 30 and a circuit board 32 shown in FIGS. 5A to 5F are formed with 1,600 electrodes 30a and 1,600 electrodes 32a, respectively. These electrodes have the same pattern as the conductor wires 2 of the SMCs 11.

Figure 5A:
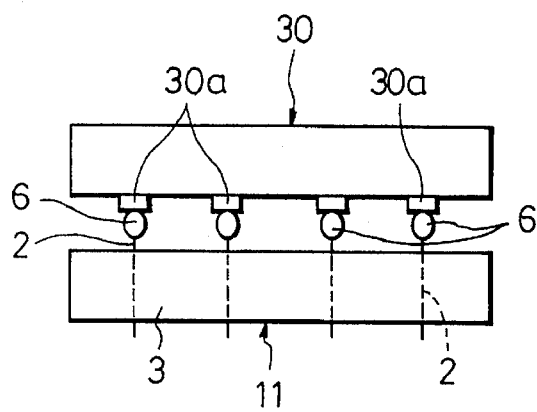
FIGS. 5A, 5B, 5C, 5D, 5E and 5F are process diagrams for illustrating the way a semiconductor chip and a circuit board are connected by means of the supermicro-connector manufactured by the method of the invention.

First, the solder bumps 6 formed individually on the conductor wires 2 of each SMC 11 were arranged opposite their corresponding electrodes 30a of the semiconductor chip 30 (FIG. 5A).

Figure 5B:
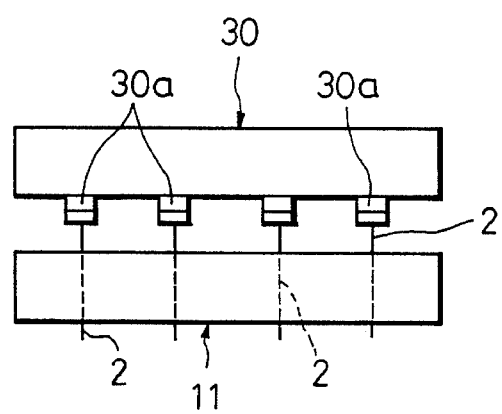

Then, the solder bumps 6 of the SMC 11 were connected to their corresponding electrodes 30a of the semiconductor chip 30 by reflow soldering (FIG. 5B).

Figure 5C:
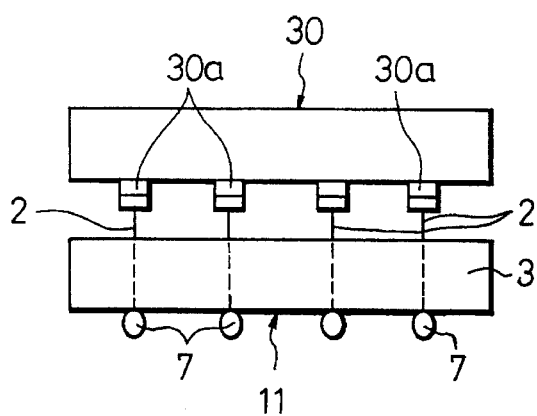

Subsequently, solder bumps 7 having a melting point lower than that of the solder bumps 6 were formed individually on the opposite ends of the conductor wires 2 which were exposed on the other side of the SMC 11 (FIG. 5C).

Figure 5D:
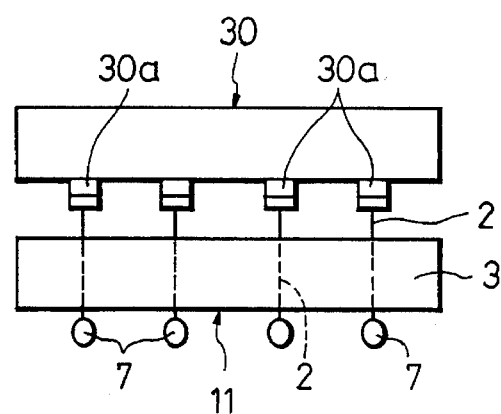
Figure 5E:
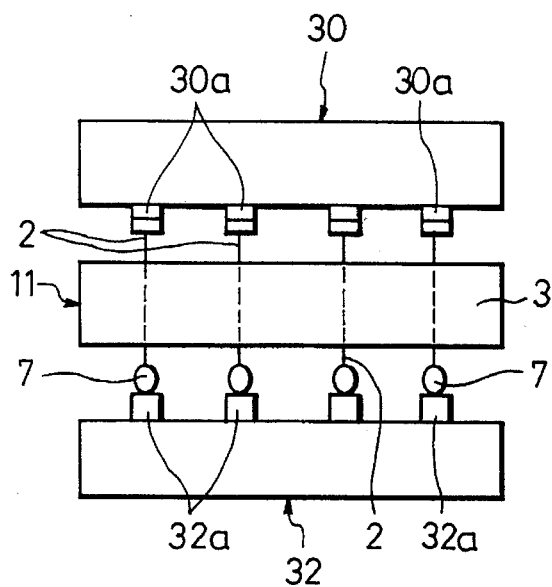

Thereafter, that portion of the insulator 3 on the side of the solder bumps 7 was dipped into the agent (2-methoxyethanol) so that its surface layer was dissolvingly removed, whereby those ends of the conductor wires 2 on the side of the solder bumps 7 were exposed for 0.25 mm (FIG. 5D).

Figure 5F:
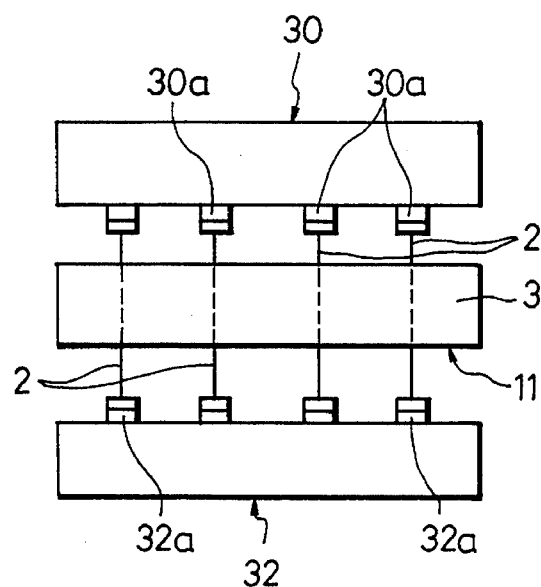

Then, the solder bumps 7 of the conductor wires 2 were situated on their corresponding electrodes 32a of the circuit board 32 (FIG. 5E), and were subjected to reflow soldering at a temperature low enough not to melt the solder bumps 6. Thus, the semiconductor chip 30 and the circuit board 32 were connected by means of the SMC 11 (FIG. 5F).

The Sn-Pb high-temperature solder was used for the solder bumps 6, as mentioned before, while an SnPb low-temperature (eutectic) solder, containing 38% Pb and 62% Sn by weight and having a melting point of 183° C., was used for the solder bath, was used for the solder bumps 7.

A prolonged deterioration test by intermittent conduction was conducted on the junctions between the conductor wires 2 of the SMCs 10 and 11 and the electrodes 30a and 32a, and the number of those SMCs 10 and 11 (per 1000 units) which suffered conduction failure between their conductor wires 2 and the electrodes 30a or 32a of the semiconductor chip 30 or the circuit board 32 was examined. Table 1 shows the result of this test.

Embodiment 7

The composite chip 5 shown in FIG. 1C was manufactured in the same manner as in Embodiment 1, using 1,600 conductor wires 2 (see FIG. 3A) which are each formed of a composite wire of 0.08-mm diameter including the core member 2b of Cu and 1% Cr by weight alloy and the covering member 2c of Nb (0.4 μm thick).

Then, the insulator 3 was dissolvingly removed from the composite chip 5 through the cut surfaces 5a and 5b thereof by means of 2-methoxyethanol, whereupon the conductor wires 2 were exposed for a length of 0.02 mm (FIG. 1D).

Subsequently, the conductor wires 2 exposed on one side of the insulator 3 were dipped into a water solution of nitric acid so that only their respective core members 2b were eroded, whereupon the depression 2d (see FIG. 3B) with the maximum depth of 70 μm was formed in the distal end face of each conductor wire.

As shown in FIG. 1E, thereafter, the solder bumps 6 were formed individually in the depressions 2d with use of the Sn-Pb high-temperature solder used in

Embodiment 1.

As in the case of Embodiment 3, moreover, that side on which the solder bumps 6 are formed was dipped again into the agent (2-methoxyethanol) to remove the insulator 3 further by dissolution, whereupon the conductor wires 2 were exposed for 0.25 mm between the solder bumps 6 and the insulator 3. Thus, each SMC 11 of FIG. 1F, measuring 15 mm by 15 mm by 1.5 mm, was manufactured.

In each SMC 11 manufactured in this manner, each solder bump 6 was formed like a sphere on the distal end face of its corresponding conductor wire 2, and this shape was common to all the wires.

Figure 4:
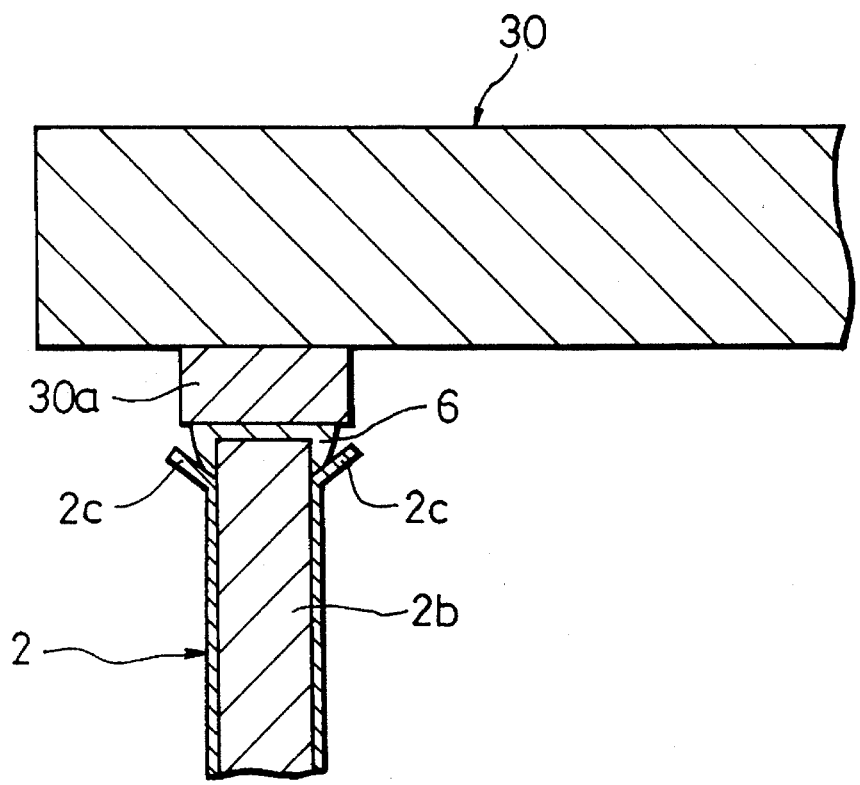
FIG. 4 is a longitudinal sectional view of a supermicro-connector using the conductor wire of FIG. 3B, showing a state after soldering.

When each SMC 11 was connected to a semiconductor chip, the top portion of the covering member 2c of Nb spread like petals, as shown in FIG. 4, so that the conductor wires 2 and their corresponding electrodes 30a of the semiconductor chip 30 were welded successfully by means of the solder from the solder bumps 6.

Further, 1,000 manufactured SMCs 11 were prepared, and were connected to the electrodes 30a and 32a of the semiconductor chips 30 and the circuit boards 32 by means of their corresponding conductor wires 2, following the steps of procedure shown in FIGS. 5A to 5F.

A prolonged deterioration test by intermittent conduction, similar to the aforesaid one, was conducted, and the number of those SMCs 11 which suffered conduction failure at the junctions between their conductor wires 2 and the electrodes 30a or 32a was examined. Table 1 also shows the result of this test.

Embodiment 8

SMCs were manufactured by using an open-topped container with a U-shaped cross section in place of the low-carbon steel pipe used in Embodiments 1 to 7.

First, a plurality of conductor wires 2 of phosphor bronze with the diameter of 0.08 mm (used in Embodiment 1) were laminated into 40 parallel conductor wire rows AW1, AW2, AW3, . . . arranged at predetermined intervals under a tension applied by means of a plurality of V-grooved bridges 25 and 26 having different heights and formed with a plurality of V-grooves arranged at regular pitches.

Figure 7A:
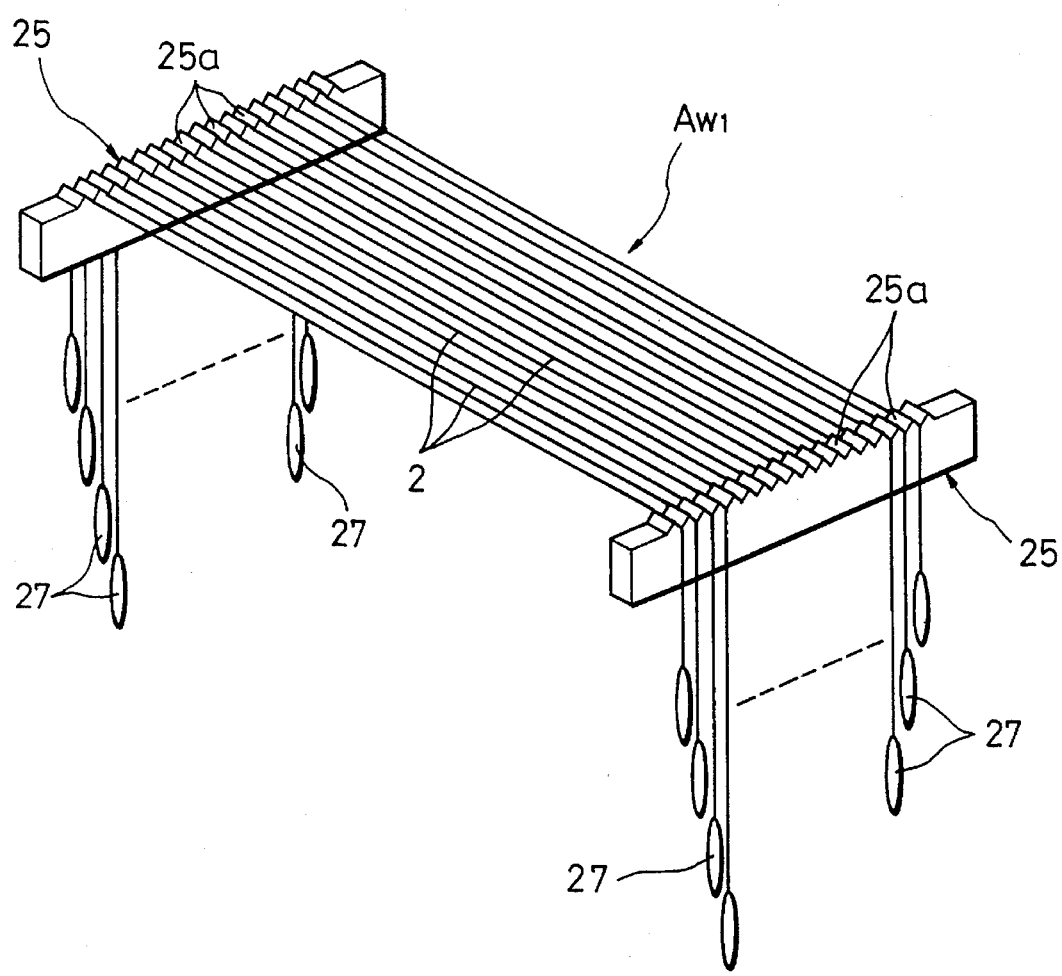
FIGS. 7A and 7B are views illustrating the way a plurality of conductor wires are stretched by means of V-grooved bridges.

More specifically, two V-grooved bridges 25, which have 40 V-grooves 25a with a bottom height h1 (see FIG. 7B), formed at intervals of 0.25 mm with high dimensional accuracy, were located at a predetermined distance from each other, as shown in FIG. 7A. The conductor wires 2 were arranged in their corresponding V-grooves 25a, and the parallel conductor wire row AW1 was formed in a manner such that a tension was applied to the wires 2 by means of 200-g weights 27 attached to the respective opposite ends of the wires 2.

Figure 7B:
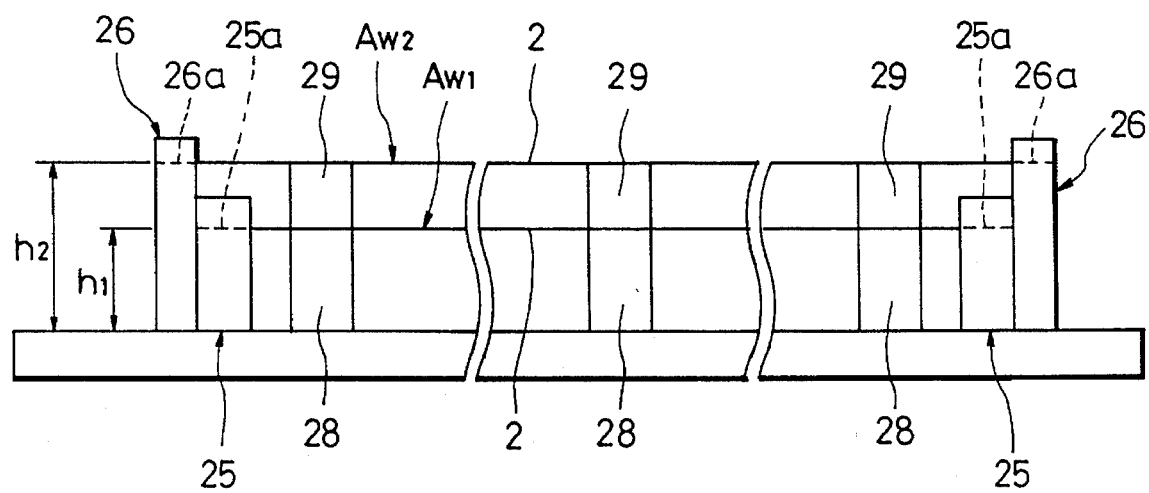

Then, two V-grooved bridges 26, which have 40 V-grooves 26a formed at intervals of 0.25 mm with high dimensional accuracy, were located outside the V-grooved bridges 25, as shown in FIG. 7B. The conductor wires 2 were arranged in their corresponding V-grooves 26a, and the parallel conductor wire row AW2 was formed over the conductor wire row AW1 in a manner such that a tension was applied to the wires 2 by means of 200-g weights 27 attached to the respective opposite ends of the wires 2. Since a bottom height h2 of the V-grooves 26a was made greater by 0.25 mm than the bottom height h1 of the V-grooves 25a, the lamination interval between the parallel conductor wire rows AW1 and AW2 was 0.25 mm.

Thereafter, the 40 parallel conductor wire rows AW1, AW2, AW3, . . . were formed by lamination in like manner.

Since the conductor wires 2 were arranged individually in the high-accuracy V-grooves 25a and 26a of the V-grooved bridges 25 and 26, in doing this, they were able to be accurately positioned with respect to the arrangement direction. As shown in FIG. 7B, moreover, the lamination intervals between the parallel conductor wire rows AW1, AW2, AW3, . . . were adjusted by interposing a necessary number of spacers 28 and 29 between the rows. As a result, the conductor wires 2 were able to be arranged substantially parallel to one another with errors in the arrangement and lamination intervals within 250 µm±10 µm.

In this state, liquid silicone rubber for use as the insulator 3 was poured into the aforesaid container and solidified therein, whereupon the composite structure 4 of FIG. 1A was formed including the conductor wires 2 and the insulator 3.

Then, the composite structure 4 was drawn out of the container (FIG. 1B), and a composite chip 5 with the thickness of 1.5 mm was cut from the structure 4 (FIG. 1C). The additional-type silicone rubber with a high degree of polymerization was used for the insulator 3. Thus, the composite chip 5 has its parallel conductor wires 2, 1,600 in total number, arranged at regular intervals in the thickness direction.

Subsequently, the composite chip 5 was dipped into 2-methoxyethanol, the insulator 3 was dissolvingly removed from the chip 5 through the cut surfaces 5a and 5b thereof, whereby the respective end portions of the conductor wires 2 were exposed for a length of 0.02 mm each (FIG. 1D).

Thereafter, each SMC 10 of FIG. 1E, measuring 15 mm by 15 mm by 1.5 mm, was manufactured by dipping the one end side of the exposed conductor wires 2 into the solder bath and forming the solder bumps 6 individually on the respective one-side ends of the exposed conductor wires 2.

The Sn-Pb high-temperature solder, containing 90% Pb and 10% Sn by weight and having the melting point of 280° to 300° C., was used for the solder bath.

Formed on the opposite end faces of the aforesaid container were comb teeth having gaps of a width equal to the diameter of the conductor wires 2, arranged vertically at the same pitches as the wires. Thus, the silicon rubber was prevented from flowing out through the end faces.

A thousand SMCs 10 thus manufactured were prepared, and were connected to the electrodes 30a and 32a of the semiconductor chips 30 and the circuit boards 32 by means of their corresponding conductor wires 2, following the steps of procedure shown in FIGS. 5A to 5F.

The same prolonged deterioration test for Embodiments 1 to 7 was conducted, and the number of those SMCs 10 which suffered conduction failure at the junctions between their conductor wires 2 and the electrodes 30a or 32a was examined. Table 1 also shows the result of this test.

Embodiment 9

Each SMC 10 of FIG. 1E, measuring 15 mm by 15 mm by 1.5 mm, was manufactured in the same manner as in Embodiment 8 except that expanded silicone rubber was used for the insulator.

A thousand SMCs 10 thus manufactured were prepared, and were connected to electrodes 30a and 32a of semiconductor chips 30 and circuit boards 32 constructed in the same manner as those of Embodiment 8, by means of their corresponding conductor wires 2, following the steps of procedure shown in FIGS. 5A to 5F. In the same manner as in Embodiment 8, moreover, the number of those SMCs 10 which suffered conduction failure was examined. Table 1 also shows the result of this test.

Embodiment 10

That side of each SMC 10 of FIG. 1E obtained in Embodiment 8 on which the solder bumps 6 are formed was dipped again into the agent (2-methoxyethanol) to remove the insulator 3 further by dissolution, whereupon the conductor wires 2 were exposed for 0.25 mm between the solder bumps 6 and the insulator 3. Thus, each SMC 11 of FIG. 1F, measuring 15 mm by 15 mm by 1.5 mm, was manufactured.

A thousand SMCs 11 thus manufactured were prepared, and were connected to electrodes 30a and 32a of semiconductor chips 30 and circuit boards 32 by means of their corresponding conductor wires 2. The connection was made following the steps of procedure shown in FIGS. 5A to 5F.

A prolonged deterioration test by intermittent conduction was conducted on the junctions between the conductor wires 2 of the SMCs 11 and the electrodes 30a and 32a, and the number of those SMCs 11 which suffered conduction failure between their conductor wires 2 and the electrodes 30a or 32a of the semiconductor chip 30 or the circuit board 32 was examined. Table 1 also shows the result of this test.

Embodiment 11

Each SMC 11 of FIG. 1F, measuring 15 mm by 15 mm by 1.5 mm, was manufactured in the same manner as in Embodiment 10 except that expanded silicone rubber was used for the insulator.

A thousand SMCs 11 thus manufactured were prepared, and were connected to the electrodes 30a and 32a of the semiconductor chips 30 and the circuit boards 32 by means of their corresponding conductor wires 2, in the same manner as in Embodiment 10.

In the same manner as in Embodiment 10, moreover, the number of those SMCs 11 which suffered conduction failure was examined. Table 1 also shows the result of this test.

Embodiment 12

Each SMC 11 of FIG. 1F, measuring 15 mm by 15 mm by 1.5 mm, was manufactured in the same manner as in Embodiment 10 except for the use of the conductor wires 2 of 0.08-mm diameter having the channels 2a, as shown in FIG. 2B.

A thousand SMCs 11 thus manufactured were prepared, and were connected to the electrodes 30a and 32a of the semiconductor chips 30 and the circuit boards 32 by means of their corresponding conductor wires 2, in the same manner as in Embodiment 10.

In the same manner as in Embodiment 10, moreover, the number of those SMCs 11 which suffered conduction failure was examined. Table 1 also shows the result of this test.

TABLE 1

|  | Type of Conductor Wire | Wire arranging means | Insulator | Number of defectives |
| --- | --- | --- | --- | --- |
| Embodiment 1 | Phosphor bronze wire | Guide plate | Silicone rubber | 6 |
| Embodiment 2 | Phosphor bronze wire | Guide plate | Expanded silicone rubber | 3 |
| Embodiment 3 | Phosphor bronze wire | Guide plate | Silicone rubber | 4 |
| Embodiment 4 | Phosphor bronze wire | Guide plate | Expanded silicone rubber | 2 |
| Embodiment 5 | Shaped wire | Guide plate | Silicone rubber | 1 |
| Embodiment 6 | Stranded wire | Guide plate | Silicone rubber | 1 |
| Embodiment 7 | Composite wire | Guide plate | Silicone rubber | — |
| Embodiment 8 | Phosphor bronze wire | V-grooved bridge | Silicone rubber | 3 |
| Embodiment 9 | Phosphor bronze wire | V-grooved bridge | Expanded silicone rubber | 2 |
| Embodiment 10 | Phosphor bronze wire | V-grooved bridge | Silicone rubber | 2 |
| Embodiment 11 | Phosphor bronze wire | V-grooved bridge | Expanded silicone rubber | 1 |
| Embodiment 12 | Shaped wire | V-grooved bridge | Silicone rubber | — |
| Embodiment 13 | Stranded wire | V-grooved bridge | Silicone rubber | 1 |
| Embodiment 14 | Composite wire | V-grooved bridge | Silicone rubber | — |
| Comparative Example 1 | — | — | — | 17 |

Embodiment 13

Each SMC 11 of FIG. 1F, measuring 15 mm by 15 mm by 1.5 mm, was manufactured in the same manner as in Embodiment 10 except for the use of stranded wires such as the one shown in FIG. 2C (7-strand wire of phosphor bronze with diameter of 0.08 mm).

A thousand SMCs 11 thus manufactured were prepared, and were connected to the electrodes 30a and 32a of the semiconductor chips 30 and the circuit boards 32 by means of their corresponding conductor wires 2, in the same manner as in Embodiment 10, and the number of those SMCs 11 which suffered conduction failure was examined. Table 1 shows the result of this test.

Embodiment 14

Each SMC 11 of FIG. 1F, measuring 15 mm by 15 mm by 1.5 mm, was manufactured in the same manner as in Embodiment 10 except for the use of the conductor wires 2 each formed of the composite wire of 0.08-mm diameter shown in FIG. 3A.

A thousand SMCs 11 thus manufactured were prepared, and were connected to the electrodes 30a and 32a of the semiconductor chips 30 and the circuit boards 32 by means of their corresponding conductor wires 2, in the same manner as in Embodiment 10. The number of those SMCs 11 which suffered conduction failure was examined. Table 1 shows the result of this test.

Comparative Example 1

A thousand semiconductor chips 30 and 1,000 circuit boards 32, each having 1,600 electrodes and used in each of the foregoing embodiments, were prepared, and the corresponding electrodes 30a and 32a were connected directly to one another by means of solder balls without using any of the SMCs manufactured by the method according to the present invention.

The semiconductor chips 30 and the circuit boards 32, thus connected directly to one another, were subjected to a prolonged deterioration test by intermittent conduction, on the junctions between the electrodes 30a and 32a, and the number of sets of the semiconductor chips 30 and the circuit boards 32 which suffered conduction failure was examined. Table 1 also shows the result of this test.

Among the connectors manufactured by the method of the present invention, there were few connectors which suffered conduction failure, as seen from Table 1. In particular, very few connectors suffered conduction failure among the SMCs of Embodiments 5, 6, 12 and 13, in which the area of contact between the conductor wires and the insulator is wide, the SMCs of Embodiments 7 and 14, in which the distal end face of each conductor wire is depressed so that the solder bumps have a uniform shape, and the SMCs of Embodiments 2, 4, 9 and 11, in which expanded silicone rubber is used for the insulator. These SMCs exhibited outstanding connecting performance.

According to Comparative Example 1, in contrast with this, 17 sets of the semiconductor chips and the circuit boards suffered conduction failure. This is attributable to the fact that soldered regions were damaged and separated by thermal strain, since the electrodes of the semiconductor chips and the circuit boards were connected directly to one another by means of the solder balls without using conductor wires.

In stretching the conductor wires, the lamination intervals were able to be adjusted more accurately by means of the spacers in the case where the V-grooved bridges were used for the wire arrangement (Embodiments 8 to 14). In this case, defective units subject to conduction failure were a little fewer than in the case where the guide plates were used for the same purpose (Embodiments 1 to 7).

In Embodiments 1 to 14 described above, soldering was repeated twice by using the two types of solders having different melting points, in connecting the respective conductors of the semiconductor chips and the circuit boards electrically to one another by means of the SMCs. Alternatively, however, the electrodes of the semiconductor chips and the circuit boards may be connected electrically to one another by means of the SMCs in one cycle of soldering operation using a solder of the same melting point.

Figure 6:
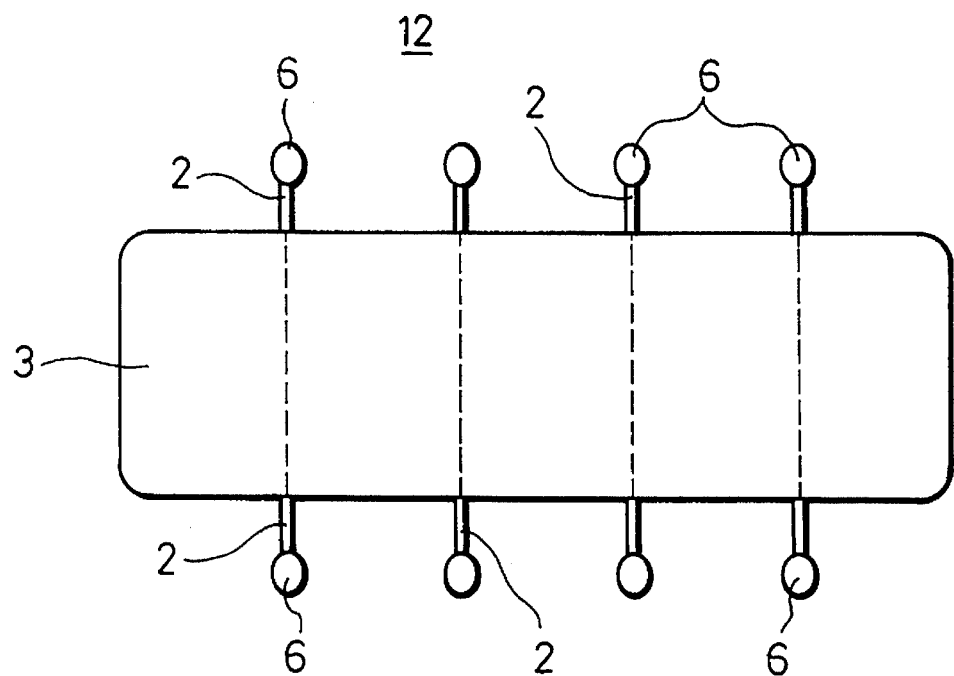
FIG. 6 is a front view showing another embodiment of the supermicro-connector manufactured by the method of the invention.

FIG. 6 shows an SMC 12 which is to be used in this case. In this SMC 12, the solder bumps 6 are formed individually on the opposite ends of each conductor wire 2 which are exposed for a predetermined length (e.g., 0.25 mm) from the opposite sides of the insulator 3.

Embodiment 15

SMCs were manufactured in the same manner as in Embodiment 3 except that a container with a U-shaped cross section and V-grooved bridges were used to stretch the conductor wires, and that condensed-type silicone rubber, which has a low degree of polymerization and contains a relatively large quantity of filler, was used for the insulator.

The time required for the arrangement of the conductor wires was much shorter than in the case where the guide plates were used. Also, the necessary time for the exposure of the conductor wires from the insulator was about half that for the case of the additional-type silicone rubber used in Embodiment 3.

The SMCs thus obtained were checked for conduction between the electrodes 30a and 32a of semiconductor chips 30 and circuit boards 32 in the same manner as in Embodiment 3. As a result, only one SMC, out of 1,000, was found to be subject to a conduction failure, which is as satisfactory as the result for the case of the expanded silicone rubber. This is because the condensed-type silicone was uniformly removed by dissolution.

Embodiment 16

SMCs were manufactured in the same manner as in Embodiment 3 except that a container with a U-shaped cross section and V-grooved bridges were used to stretch the conductor wires, and that the respective end portions of the conductor wires 2 were exposed individually through the opposite sides of the composite chip 5, one exposed end face of each wire 2 was connected electrically to the electrode plate 22 through the electrically conductive paste 20, and the solder bumps 6 were formed on the other exposed end face of each wire 2 by electroplating, as shown in FIG. 8.

In this case, the length of exposure of the bump-side end portion of each conductor wire 2 was 0.1 mm, while that of the wire end portion on the electrical supply side was 0.25 mm. The conductive paste 20, which was prepared by dispersing copper powder in resin paste, was applied to the exposed end portions of the conductor wires on the electrical supply side. After the paste 20 was dried and solidified, the conductor wires 2 were connected to the electrode plate 22.

Subsequently, after the paste 20 and the electrode plate 22 were insulated by means of the manicure layer 21, the exposed end portions of the conductor wires 2 were dipped into a solder bath, and a predetermined voltage was applied between the electrodes to form the solder bumps 6 by electroplating.

The SMCs thus obtained were checked for the size and variability of the solder bumps 6. All the bumps 6 were substantially spherical in shape. A hundred solder bumps 6 were selected at random, and their respective diameters were measured. Thereupon, the average and standard deviation of the diameters of the 100 bumps 6 were found to be 120 μm and 0.6 μm, respectively.

The same measurement was made on 100 SMCs manufactured by the method of Embodiment 3. As a result, most of the solder bumps 6 of these SMCs were found to be substantially spherical in shape. However, the respective diameters of the bumps were as small as 80 to 100 μm, and the standard deviation was as great as 2.7 μm.

Embodiment 17

Solder bumps 6 were formed by electroplating in the same manner as in Embodiment 16 except that In-based solder, in place of the electrically conductive paste, was deposited on the supply-side exposed end portions of conductor wires (phosphor bronze wires plated with Au), and a metallic electrode plate was connected directly to the In-based solder. After the electroplating was finished, the In-based solder was heated and removed by dissolution, and the residue of In was washed away with nitric acid.

The solder bumps 6 of the SMCs thus obtained were substantially spherical in shape. The diameter of the bumps 6 was 120 µm, and the standard deviation was found to be 0.45 µm, which is lower than the value for Embodiment 16. A conduction test revealed no defectives, and a gold deposit on the conductor wires was not damaged.

What is claimed is:

1. A manufacturing method for a supermicro-connector, comprising:

a step of fixing a plurality of conductor wires, arranged substantially parallel to one another, by means of an elastic insulator interposed between the conductor wires, thereby making a composite structure formed of the conductor wires and the insulator;

a step of cutting the composite structure along a plane extending at right angles to the conductor wires, thereby making a plurality of composite chips;

a step of removing the insulator from at least one cut surface of each of the composite chips by dissolution by means of an agent, thereby exposing respective end portions of the conductor wires for a predetermined length; and a step of forming solder bumps individually on the respective exposed end portions of the conductor wires.

2. A manufacturing method for a supermicro-connector according to claim 1, further comprising a step of further removing the insulator on the side for the formation of the solder bumps by dissolution by means of the agent, thereby exposing the conductor wires for a predetermined length between the solder bumps and the insulator, after the step of forming the solder bumps on the exposed end portions of the conductor wires.

3. A manufacturing method for a supermicro-connector according to claim 1, wherein said elastic insulator is an expanded silicone rubber.

4. A manufacturing method for a supermicro-connector according to claim 2, wherein said elastic insulator is an expanded silicone rubber.

5. A manufacturing method for a supermicro-connector according to claim 1, wherein each said conductor wire is formed, on the surface thereof, with a number of linear or spiral channels each having an opening with a width smaller than that of the inner part thereof.

6. A manufacturing method for a supermicro-connector according to claim 2, wherein each said conductor wire is formed, on the surface thereof, with a necessary number of linear or spiral channels each having an opening with a width smaller than that of the inner part thereof.

7. A manufacturing method for a supermicro-connector according to claim 1, wherein each said conductor wire is a stranded wire or a composite wire formed by joining and bonding a plurality of wires together so that the surface of the conductor wire is rugged.

8. A manufacturing method for a supermicro-connector according to claim 2, wherein each said conductor wire is a stranded wire or a composite wire formed by joining and bonding a plurality of wires together so that the surface of the conductor wire is rugged.

9. A manufacturing method for a supermicro-connector according to claim 1, wherein each said conductor wire is a composite wire formed of a core member erodible by a specific corrosive agent and a covering member not erodible by the corrosive agent.

10. A manufacturing method for a supermicro-connector according to claim 2, wherein each said conductor wire is a composite wire formed of a core member erodible by a specific corrosive agent and a covering member not erodible by the corrosive agent.

11. A manufacturing method for a supermicro-connector according to claim 1, wherein said conductor wires are bonded to the elastic insulator by means of an adhesive agent.

12. A manufacturing method for a supermicro-connector according to claim 2, wherein said conductor wires are bonded to the elastic insulator by means of an adhesive agent.

13. A manufacturing method for a supermicro-connector according to claim 1, wherein said plurality of conductor wires are laminated into a plurality of parallel conductor wire rows arranged at predetermined intervals under a tension applied by means of a plurality of members having different heights and formed with a plurality of V-grooves arranged at regular pitches, in said step of fixing the plurality of conductor wires, arranged substantially parallel to one another, by means of the elastic insulator interposed between the conductor wires, thereby making the composite structure formed of the conductor wires and the insulator.

14. A manufacturing method for a supermicro-connector according to claim 2, wherein said plurality of conductor wires are laminated into a plurality of parallel conductor wire rows arranged at predetermined intervals under a tension applied by means of a plurality of members having different heights and formed with a plurality of V-grooves arranged at regular pitches, in said step of fixing the plurality of conductor wires, arranged substantially parallel to one another, by means of the elastic insulator interposed between the conductor wires, thereby making the composite structure formed of the conductor wires and the insulator.

15. A manufacturing method for a supermicro-connector according to claim 13, wherein each said conductor wire is subjected to a tension by means of a weight attached to an end portion thereof.

16. A manufacturing method for a supermicro-connector according to claim 14, wherein each said conductor wire is subjected to a tension by means of a weight attached to an end portion thereof.

17. A manufacturing method for a supermicro-connector according to claim 13, wherein said lamination intervals between the parallel conductor wire rows are adjusted by means of spacers interposed between the wire rows.

18. A manufacturing method for a supermicro-connector according to claim 14, wherein said lamination intervals between the parallel conductor wire rows are adjusted by means of spacers interposed between the wire rows.

19. A manufacturing method for a supermicro-connector according to claim 15, wherein said lamination intervals between the parallel conductor wire rows are adjusted by means of spacers interposed between the wire rows.

20. A manufacturing method for a supermicro-connector according to claim 16, wherein said lamination intervals between the parallel conductor wire rows are adjusted by means of spacers interposed between the wire rows.

21. A manufacturing method for a supermicro-connector according to claim 1, wherein said elastic insulator is a condensed-type silicone rubber.

22. A manufacturing method for a supermicro-connector according to claim 2, wherein said elastic insulator is a condensed-type silicone rubber.

23. A manufacturing method for a supermicro-connector according to claim 1, wherein the respective end portions of the conductor wires are exposed from both cut surfaces of each of the composite chips, those end portions of the conductor wires which are exposed from one of the cut surfaces are connected electrically to a metallic electrode plate, and the solder bumps are formed individually, by electroplating, on those end portions of the conductor wires which are exposed from the other cut surface, in the step of removing the insulator from at least one cut surface of each of the composite chips by dissolution by means of the agent, thereby exposing the respective end portions of the conductor wires for the predetermined length, and the step of forming the solder bumps individually on the respective exposed end portions of the conductor wires.

24. A manufacturing method for a supermicro-connector according to claim 2, wherein the respective end portions of the conductor wires are exposed from both cut surfaces of each of the composite chips, those end portions of the conductor wires which are exposed from one of the cut surfaces are connected electrically to a metallic electrode plate, and the solder bumps are formed individually, by electroplating, on those end portions of the conductor wires which are exposed from the other cut surface, in the step of removing the insulator from at least one cut surface of each of the composite chips by dissolution by means of the agent, thereby exposing the respective end portions of the conductor wires for the predetermined length, and the step of forming the solder bumps individually on the respective exposed end portions of the conductor wires.

25. A manufacturing method for a supermicro-connector according to claim 23, wherein electrically conductive paste is applied to the one cut surface of each of the composite chip along with the exposed conductor wires, the surface of the paste is coated for insulation, and the conductor wires exposed from the one cut surface and the conductive paste are brought into contact with a conductor connected to a power source, to be supplied with electric power, whereby the solder bumps are formed by electroplating on the conductor wires exposed from the other cut surface.

26. A manufacturing method for a supermicro-connector according to claim 24, wherein electrically conductive paste is applied to the one cut surface of each of the composite chip along with the exposed conductor wires, the surface of the paste is coated for insulation, and the conductor wires exposed from the one cut surface and the conductive paste are brought into contact with a conductor connected to a power source, to be supplied with electric power, whereby the solder bumps are formed by electroplating on the conductor wires exposed from the other cut surface.

27. A manufacturing method for a supermicro-connector according to claim 1, wherein said plurality of conductor wires are gold wires or gilt conductor wires.

28. A manufacturing method for a supermicro-connector according to claim 2, wherein said plurality of conductor wires are gold wires or gilt conductor wires.

29. A manufacturing method for a supermicro-connector according to claim 1, wherein the surface of each said conductor wire is roughened by an electrolytic treatment or chemical etching.

30. A manufacturing method for a supermicro-connector according to claim 2, wherein the surface of each said conductor wire is roughened by an electrolytic treatment or chemical etching.

* * * * *